United States Patent
Akester et al.

(10) Patent No.: US 11,670,008 B2
(45) Date of Patent: Jun. 6, 2023

(54) PROCESSING DISPLAY DATA FOR TRANSMISSION

(71) Applicant: DisplayLink (UK) Limited, Cambridge (GB)

(72) Inventors: Richard Akester, Cambridge (GB); Patrick David Cooper, Cambridge (GB)

(73) Assignee: DISPLAYLINK (UK) LIMITED, Cambridgeshire (GB)

( * ) Notice: Subject to any disclaimer, the term of this patent is extended or adjusted under 35 U.S.C. 154(b) by 414 days.

(21) Appl. No.: 16/932,985

(22) Filed: Jul. 20, 2020

(65) Prior Publication Data

US 2021/0019915 A1    Jan. 21, 2021

(30) Foreign Application Priority Data

Jul. 19, 2019  (GB) ...................... 1910355

(51) Int. Cl.
  *G06T 9/00*  (2006.01)
  *H04N 1/32*  (2006.01)
  (Continued)

(52) U.S. Cl.
  CPC ................ *G06T 9/00* (2013.01); *G09G 5/37* (2013.01); *H03M 7/3059* (2013.01);
  (Continued)

(58) Field of Classification Search
  None
  See application file for complete search history.

(56) References Cited

U.S. PATENT DOCUMENTS

| 2003/0169928 A1* | 9/2003 | Stanek | G06T 9/007 |
| | | | 382/232 |
| 2004/0045030 A1* | 3/2004 | Reynolds | H04N 19/12 |
| | | | 725/110 |

(Continued)

FOREIGN PATENT DOCUMENTS

| EP | 1078529 B1 | 7/2013 |
| GB | 2563413 A | 12/2018 |
| GB | 2569610 A | 6/2019 |

OTHER PUBLICATIONS

Kamrul Talukder, Haar Wavelet Based Approch for Image Compression and Quality Assessment of Compressed Image, Feb. 2007, IAENG International Journal of Applied Mathematics, p. 5, https://arxiv.org/abs/1010.4084. (Year: 2007).*

(Continued)

*Primary Examiner* — Joni Hsu
(74) *Attorney, Agent, or Firm* — Paradice & Li LLP

(57) ABSTRACT

A method for compressing display data is disclosed. The method comprises performing a wavelet transformation to obtain a general approximation coefficient and a plurality of detail coefficients for a group of pixels; determining whether to prioritise transmission of the general approximation coefficient over transmission of the detail coefficients based on whether there are sufficient resources available to enable a corresponding image frame to be ready for display and/or based on a time since the detail coefficients for a corresponding group of pixels were previously transmitted. If it is determined that transmission of the general approximation coefficient is to be prioritised over transmission of the detail coefficients, the method comprises either: transmitting only the general approximation coefficient, or compressing at least one detail coefficient so as to be more compressed than the general approximation coefficient and transmitting the (Continued)

general approximation coefficient and the at least one compressed detail coefficient.

20 Claims, 6 Drawing Sheets

(51) Int. Cl.
*H04N 19/00* (2014.01)
*G09G 5/37* (2006.01)
*H03M 7/30* (2006.01)

(52) U.S. Cl.
CPC ........... *H04N 1/3217* (2013.01); *H04N 19/00* (2013.01); *G09G 2340/02* (2013.01); *G09G 2350/00* (2013.01); *G09G 2360/18* (2013.01); *G09G 2370/02* (2013.01)

(56) References Cited

U.S. PATENT DOCUMENTS

2017/0155905 A1   6/2017  Puri et al.
2017/0359478 A1*  12/2017  Deshpande ............... G06T 9/00

OTHER PUBLICATIONS

UK Search Report for corresponding patent application No. GB1910355.5, dated Jan. 2, 2020, 17 pages.
Naser et al., CE6-related: MTS with Haar transform for Screen Contents Coding, Joint Video Experts Team (JVET) of ITU-T SG 16 WP 3 and ISO/IEC JTC 1/SC 29/WG 11, 13th Meeting: Marrakech, MA, 9-18, Jan. 18, 2019, 11 pages.

* cited by examiner

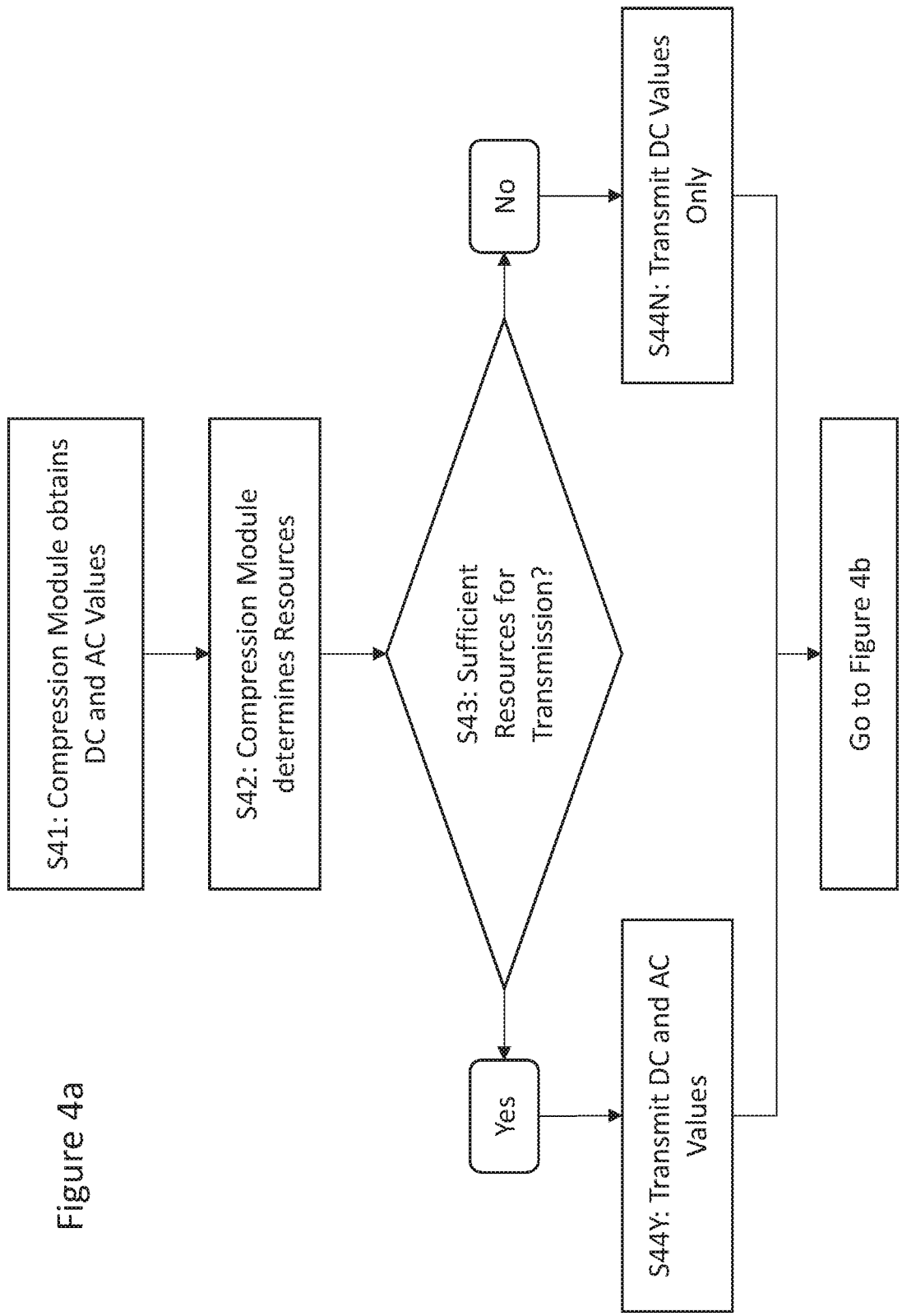

PROCESSING DISPLAY DATA FOR TRANSMISSION

CROSS-REFERENCE TO RELATED APPLICATIONS

This application claims priority to Great Britain Patent Application No. GB1910355.5, entitled PROCESSING DISPLAY DATA, filed Jul. 19, 2019, which is incorporated herein by reference.

BACKGROUND

Image data is often transmitted between a device where it is generated and a device on which it is displayed or which controls a device on which it is displayed. Often, the image data is transferred over a bandwidth limited transmission medium, and it is therefore often compressed (or encoded) prior to transmission in order to minimise the bandwidth required for its transmission. A commonly-used type of compression algorithm is based on Daubechies waveforms. Of these, the most commonly-used algorithm is the Haar transform, which produces high-frequency and low-frequency coefficients that can then be algorithmically combined in order to recreate at least an approximation of the original display data.

However, even when the data is compressed it may not be possible to transmit the compressed image data across a limited-bandwidth connection quickly enough for it to be displayed with minimal delay, or latency, and without visual artefacts such as tearing.

The present invention seeks to solve or at least mitigate this problem.

SUMMARY

Aspects of the invention are set out in the independent claims and preferred features are set out in the dependent claims.

In a first aspect the invention provides a method for compressing display data at a host device for transmission to a client device, wherein the display data comprises groups of pixels, the groups of pixels together forming an image frame, each pixel having a corresponding pixel value, the method comprising:

receiving pixel values for a group of pixels in an image frame of the display data;

performing a wavelet transformation on the group of pixels to obtain a general approximation coefficient and a plurality of detail coefficients for the group of pixels;

determining whether to prioritise transmission of the general approximation coefficient over transmission of the detail coefficients to the client device based on whether there are sufficient resources available to enable the image frame to be ready for display by the client device and/or based on a time since the detail coefficients for a corresponding group in a previous frame were previously transmitted to the client device; and if it is determined that transmission of the general approximation coefficient is to be prioritised over transmission of the detail coefficients, then either:

a) transmitting only the general approximation coefficient to the client device, or b) compressing at least one detail coefficient so as to be more compressed than the general approximation coefficient and transmitting the general approximation coefficient and the at least one compressed detail coefficient to the client device.

The method may comprise, if it is determined that transmission of the general approximation coefficient is to be prioritised over transmission of the detail coefficients, determining whether only the general approximation coefficient is to be transmitted to the client device, or whether the general approximation coefficient and the at least one compressed detail coefficient is to be transmitted to the client device, based on whether there are sufficient resources available to enable the image frame to be ready for display by the client device and/or based on the time since the at least one detail coefficient for a corresponding group in a previous frame was previously transmitted to the client device.

Determining whether only the general approximation coefficient is to be transmitted to the client device, or whether the general approximation coefficient and the at least one compressed detail coefficient is to be transmitted to the client device may comprise:

determining resources available to enable the image frame to be ready for display by the client device;

determining whether there are sufficient resources for the at least one compressed detail coefficient to be transmitted, together with the general approximation coefficient, whether uncompressed or compressed, and used to enable the image frame to be ready for display by the client device; and if it is determined that there are sufficient resources for the at least one compressed detail coefficient to be transmitted, together with the uncompressed general approximation coefficient, and used to enable the image frame to be ready for display by the client device, compressing the at least one detail coefficient and transmitting the uncompressed general approximation coefficient and the at least one compressed detail coefficient to the client device;

if it is determined that there are insufficient resources for the at least one compressed detail coefficient to be transmitted, together with the uncompressed general approximation coefficient, and used to enable the image frame to be ready for display by the client device, determining whether there are sufficient resources for the at least one compressed detail coefficients to be transmitted, together with a compressed general approximation coefficient, and used to enable the image frame to be ready for display by the client device, and, if it is determined that there are sufficient resources for the at least one compressed detail coefficient to be transmitted, together with a compressed general approximation coefficient, and used to enable the image frame to be ready for display by the client device, compressing the at least one detail coefficient and compressing the general approximation coefficient, wherein the at least one detail coefficient is compressed at a higher level than the general approximation coefficient, and transmitting the compressed general approximation coefficient and the at least one compressed detail coefficient to the client device;

if it is determined that there are insufficient resources for compressed detail coefficients to be transmitted, together with the compressed general approximation coefficient, and used to enable the image frame to be ready for display by the client device, determining whether there are sufficient resources for only the uncompressed general approximation coefficient to be transmitted to the client device, and used to enable the image frame to be ready for display by the client device, and if it is determined that there are sufficient resources for only the uncompressed general approximation coefficient to be transmitted to the client device, and used to enable the image frame to be ready for display by the client device, transmitting only the uncompressed general approximation coefficient to be transmitted to the client device; and if it is determined that there are insufficient resources for only the uncompressed general approximation coefficient to be transmitted to the client device, and used to enable the image frame to be ready for display by the client device, compressing the general approximation coefficient, and transmitting only the compressed general approximation coefficient to the client device.

Compressing at least one detail coefficient so as to be more compressed than the general approximation coefficient may comprise:

determining resources available to enable the image frame to be ready for display by the client device;

determining whether there are sufficient resources for the at least one compressed detail coefficient to be transmitted, together with an uncompressed general approximation coefficient, and used to enable the image frame to be ready for display by the client device;

if it is determined that there are sufficient resources for the at least one compressed detail coefficient to be transmitted, together with the uncompressed general approximation coefficient, and used to enable the image frame to be ready for display by the client device, compressing the at least one detail coefficient and transmitting the uncompressed general approximation coefficient and the at least one compressed detail coefficient to the client device;

if it is determined that there are insufficient resources for the at least one compressed detail coefficient to be transmitted, together with the uncompressed general approximation coefficient, and used to enable the image frame to be ready for display by the client device, compressing the at least one detail coefficient and compressing the general approximation coefficient, wherein the at least one detail coefficient is compressed at a higher level than the general approximation coefficient, and transmitting the compressed general approximation coefficient and the at least one compressed detail coefficient to the client device.

The method may comprise, if it is determined that there are sufficient resources for the at least one compressed detail coefficient to be transmitted, together with the uncompressed general approximation coefficient: determining a first level of compression that enables the at least one compressed detail coefficient to be transmitted, together with the uncompressed general approximation coefficient, and used to enable the image frame to be ready for display by the client device; and compressing the at least one detail coefficient using the first level of compression.

The method may comprise, if it is determined that there are sufficient resources for the at least one compressed detail coefficient to be transmitted, together with the compressed general approximation coefficient: determining a second level of compression that enables the at least one compressed detail coefficient to be transmitted, together with the compressed general approximation coefficient, and used to enable the image frame to be ready for display by the client device; determining a third level of compression to be applied to the general approximation coefficient to be transmitted, together with the at least one compressed detail coefficient, and used to enable the image frame to be ready for display by the client device, wherein the second level of compression is higher than the third level of compression; compressing the at least one detail coefficient using the second level of compression; and compressing the general approximation coefficient using the third level of compression.

The method may comprise, if it is determined that there are insufficient resources for the at least one compressed detail coefficient to be transmitted, together with the uncompressed general approximation coefficient, and used to enable the image frame to be ready for display by the client device: determining a second level of compression that enables the at least one compressed detail coefficient to be transmitted, together with the compressed general approximation coefficient, and used to enable the image frame to be ready for display by the client device; determining a third level of compression to be applied to the general approximation coefficient to be transmitted, together with the at least one compressed detail coefficient, and used to enable the image frame to be ready for display by the client device, wherein the second level of compression is higher than the third level of compression; compressing the at least one detail coefficient using the second level of compression; and compressing the general approximation coefficient using the third level of compression.

The method may comprise, if it is determined that there are insufficient resources for only the uncompressed general approximation coefficient to be transmitted to the client device, and used to enable the image frame to be ready for display by the client device: determining a fourth level of compression for the general approximation coefficient to enable the compressed general approximation coefficient to be transmitted to the client device, and used to enable the image frame to be ready for display by the client device; and compressing the general approximation coefficient using the fourth level of compression.

The resources available to enable the image frame to be ready for display by the client device may comprise one or more of: actual or estimated capabilities of the host device, actual or estimated capabilities of the client device, actual or estimated capabilities of a transport mechanism between the host device and the client device or changes in the transport mechanism.

The transport mechanism may comprise a bandwidth limited connection.

The actual or estimated capability of the transport mechanism may comprise an actual or estimated available bandwidth, an actual or estimated capability of a processing resource of the host device, and/or an actual or estimated capability of a processing resource of the client device.

The time since the detail coefficients for a corresponding group in a previous frame were previously transmitted to the client device may comprise either a time since compressed detail coefficients for a corresponding group in a previous frame were sent to the client device or a time since uncompressed detail coefficients for a corresponding group in a previous frame were sent to the client device.

The method may further comprise: determining whether the time since compressed detail coefficients for a corresponding group in a previous frame were sent to the client device exceeds a threshold time; and if it is determined that the time since compressed detail coefficients for a corresponding group in a previous frame were sent to the client device exceeds the threshold time, determining that the detail coefficients are to be transmitted to the client device.

The method may further comprise: determining whether the time since uncompressed detail coefficients for a corresponding group in a previous frame were sent to the client device exceeds a threshold time; and if it is determined that the time since uncompressed detail coefficients for a corresponding group in a previous frame were sent to the client device exceeds the threshold time, determining that the detail coefficients are to be transmitted to the client device.

The general approximation coefficient may be generated using a mipmap associated with the frame of display data.

The method may further comprise: determining, for the group of pixels, whether there has been a change in at least one pixel value of the pixels in the group compared to the corresponding pixel values of the corresponding group of pixels of a previous frame of display data; and transmitting the at least one detail coefficient to the client device only when there has been a change in at least one of the pixel values.

The general approximation coefficient and the detail coefficients may be obtained from the pixel values of the pixels in the group of pixels according to:

$$W=(A+B)+(C+D);$$

$$x=(A-B)+(C-D);$$

$$y=(A+B)-(C+D);$$

$$z=(A-B)-(C-D);$$

where: A, B, C, and D are the pixel values of the pixels in the group of pixels; W is the general approximation coefficient; and x, y and z are the detail coefficients.

The wavelet transformation may be a Haar transformation.

In a second aspect the invention provides a method of decompressing compressed display data at a client device, the method comprising:

receiving, from a host device, compressed display data;

determining whether the received compressed display data comprises only a general approximation coefficient, or whether the received compressed display data comprises the general approximation coefficient and at least one detail coefficient for a group of pixels to be displayed, the general approximation coefficient and the at least one detail coefficient having been obtained using a wavelet transformation of the group of pixels;

if it is determined that the received compressed display data comprises only the general approximation coefficient, retrieving at least one detail coefficient previously received from the host device and stored at the client device; and decompressing the compressed display data using the general approximation coefficient and the retrieved at least one detail coefficient to produce pixel values of pixels in the group of pixels to be displayed.

The received compressed display data may include a header comprising an indication of whether the received compressed display data comprises only the general approximation coefficient, or whether the received compressed display data comprises the general approximation coefficient and at least one detail coefficient, and the determination of whether the received compressed display data comprises only the general approximation coefficient, or whether the received compressed display data comprises the general approximation coefficient and at least one detail coefficient may be made using the indication.

The method may further comprise: receiving a signal from the host device, the signal being transmitted separately from the compressed display data, and the signal comprising an indication of whether the received compressed display data comprises only the general approximation coefficient, or whether the received compressed display data comprises the general approximation coefficient and at least one detail coefficient, and the determination of whether the received compressed display data comprises only the general approximation coefficient, or whether the received compressed display data comprises the general approximation coefficient and at least one detail coefficient may be made using the indication.

The wavelet transformation may be a Haar transformation.

In a third aspect the invention provides a host device configured to perform all steps of a method according to the first aspect of the invention.

In a fourth aspect the invention provides a client device configured to perform all steps of a method according to the second aspect of the invention.

In a fifth aspect the invention provides a system comprising a host device according to the third aspect of the invention and a client device according to the fourth aspect of the invention.

In one example a method of encoding display data for transmission across a limited-bandwidth connection, comprises:

1. Obtaining DC and AC values for a frame of display data.
2. Determining the resources available for transmission of data.
3. If there are sufficient resources available for transmission of both DC and AC values, transmitting and decoding the DC and AC values as normal.
4. Otherwise, preferentially transmitting the DC values and optionally decoding them alongside historical AC values.
5. Displaying the decoded display data.

This allows a limited volume of data to be transmitted when necessary and an approximate image to be displayed at the end of the process, since the DC values act as an estimation of the display data that can be refined using the AC values, which are likely to be similar enough to provide an approximation of the original frame.

Preferential transmission of the DC values may mean transmitting the DC values only or may mean transmitting the DC and AC values but compressing the AC values more heavily than the DC values, for example by applying a greater level of quantisation to then. This may result in greater data loss to the AC values than the DC values.

The DC values can be extracted from a mipmap supplied alongside the data by the GPU. Alternatively, the DC and AC values can be generated through compression with a wavelet transform such as a Haar transform.

In some examples, the host may determine how long it has been since ACs were transmitted or ACs that had not suffered lossy compression were transmitted and factor this into the determination of whether to preferentially transmit DCs such that, if the time exceeds a threshold, it transmits the ACs regardless of resources available. This will allow the system to avoid errors introduced by drift over time.

In some examples, the ACs may only be transmitted for changed areas and in all unchanged areas the DC values are preferentially transmitted. Alternatively, the methods of the invention may only be used at all in changed areas. In either of these cases, if only part of a frame is updated or only part of a frame is using historical AC values and updated DC values or highly-compressed AC values and less-compressed DC values, this area or the edges of it could be slightly blurred in order to conceal any errors introduced by the methods of the invention. Additionally, such blurring could be applied in the periphery of the displayed image only, leaving the foveal area clear.

Any system feature as described herein may also be provided as a method feature, and vice versa. As used herein, means plus function features may be expressed alternatively in terms of their corresponding structure.

Any feature in one aspect of the invention may be applied to other aspects of the invention, in any appropriate combination. Furthermore, any, some and/or all features in one aspect can be applied to any, some and/or all features in any other aspect, in any appropriate combination.

It should also be appreciated that particular combinations of the various features described and defined in any aspects of the invention can be implemented and/or supplied and/or used independently.

BRIEF DESCRIPTION OF THE DRAWINGS

Embodiments will now be described, by way of example only and with reference to the accompanying drawings, in which:

FIG. 4a shows an exemplary process of compressing and transmitting data;

DETAILED DESCRIPTION

Figure 1:
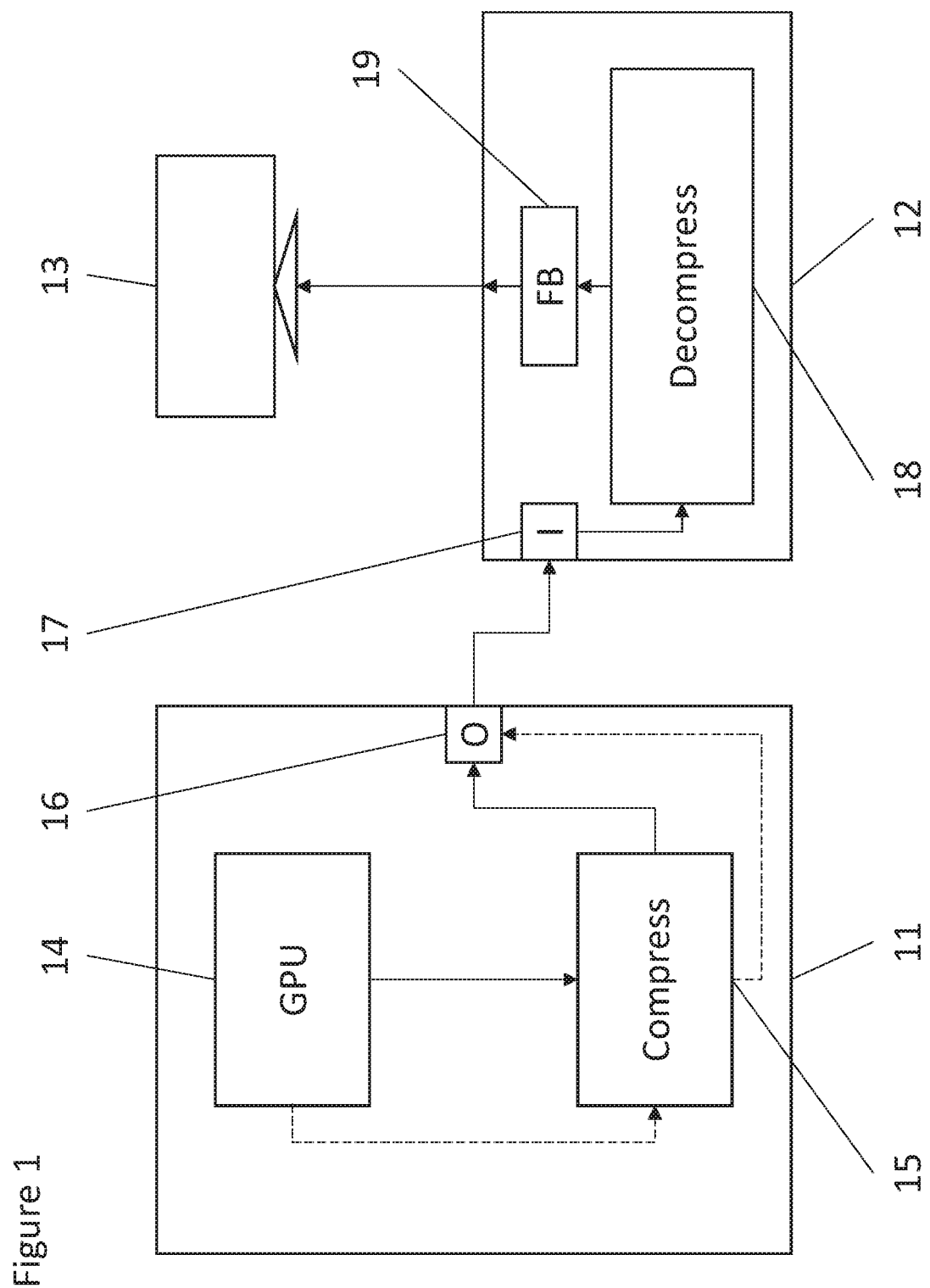
FIG. 1 shows an exemplary block diagram of a display system.

FIG. 1 shows an exemplary block diagram of a display system, comprising a host computing device [11], connected to a display control device [12] such as a docking station, which is in turn connected to a display panel [13]. The connections may be wired or wireless and/or across a network, including, for example, the internet. Likewise, two or more of the devices may be co-located, i.e. contained in a single casing such that they appear to be a single device. For example, the display control device [12] and the display panel [13] may be contained in a virtual-reality headset.

The host computing device [11] comprises a processor [14] which runs an application which generates display data for display on the display panel [13]. The display data is then passed to a compression module [15], which applies a compression algorithm in order to reduce the volume of the data in preparation for transmission across the bandwidth-limited connection to the display control device [12]. The compressed data is then passed to an output module [16] for transmission. The output module [16] controls the connection and determines bandwidth and other resources available on the connection and can also send feedback to the compression module [15] regarding such resources.

The display control device [12] comprises an input module [17], which controls the display control device [12] end of the connection to the host computing device [11] and receives data transmitted by the host computing device [11]. The input module [17] is connected to a decompression module [18], which decompresses the received data by reversing the compression algorithm used by the compression module on the host computing device [11]. Finally, the display control device [12] contains a frame buffer [19], which stores the decompressed display data in preparation for sending it for display on the display panel [13].

Figure 2:
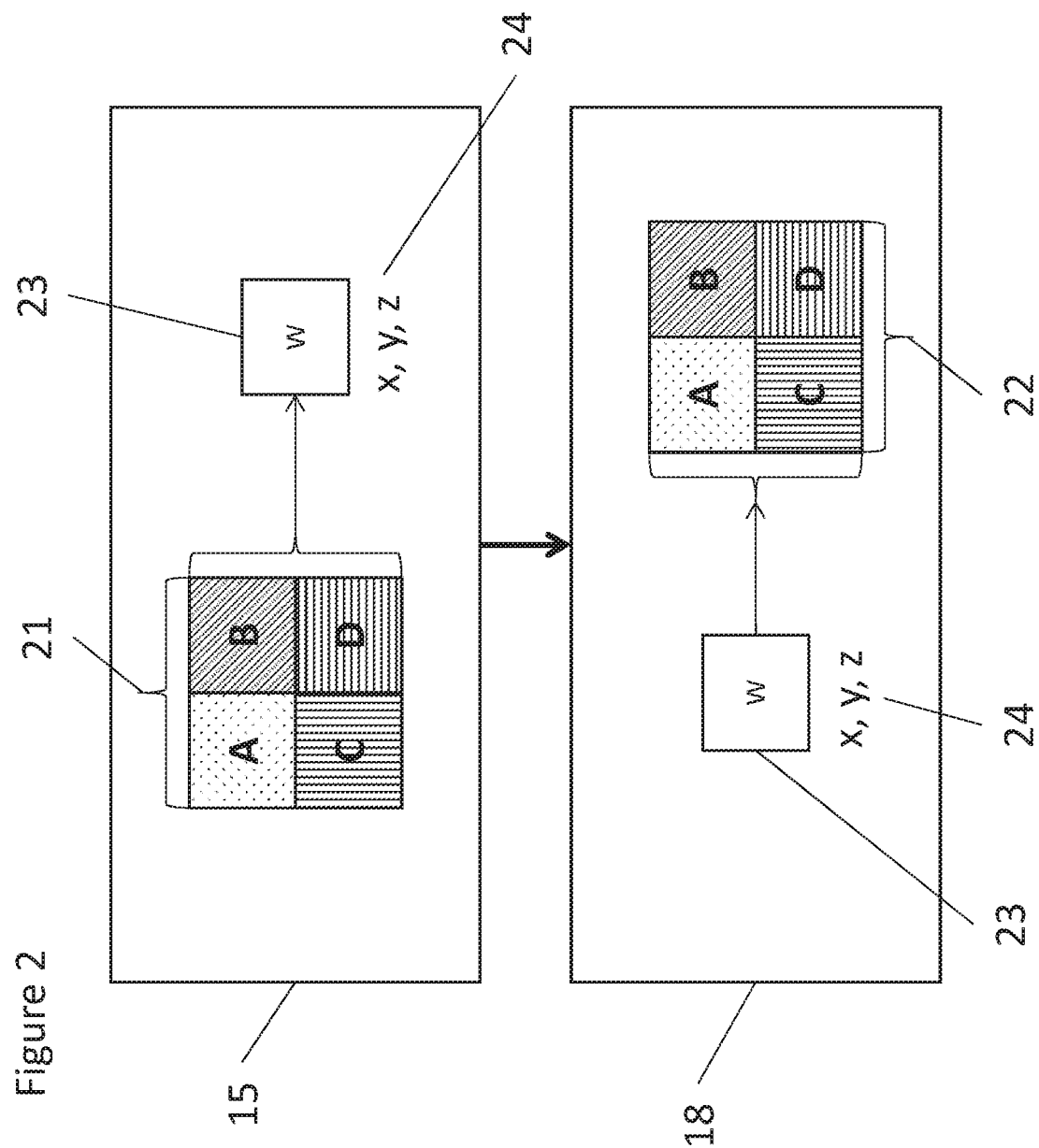
FIG. 2 shows an exemplary simplified version of the process of a Haar transform.

FIG. 2 shows an exemplary simplified version of a process of a Haar transform, which is a commonly-used part of compression. It produces a DC value and three coefficients, or AC, values for each tile of display data. These values are then transmitted to the display control device for decompression and display as previously mentioned.

In the example shown in FIG. 2, a tile [21] comprising four pixels [21A, B, C, D] is passed to the compression module [15]. The tile [21] in this example comprises four pixels [21A, B, C, D], but may comprise greater or fewer than four pixels in other implementations. Each pixel [21A, B, C, D] has a value indicating its colour, here represented by the pattern of hatching. The first pixel [21A] is marked with dots and considered to have the lightest colour. The second pixel [21B] is marked with diagonal hatching and is considered to have the darkest colour. The third pixel [21C] is marked with vertical hatching and is considered to have a light colour, and the fourth pixel [21D] is marked with horizontal hatching and is considered to have a dark colour. The values of the four pixels [21A, B, C, D] are combined to produce a single pixel [23], referred to as "W", the DC value, as well as a set of coefficients [24] referred to in FIG. 2 as "x, y, z", the AC values. The DC value [23] is generated from a sum of the values of all four pixels [21A, B, C, D]: ((A+B)+(C+D)). The value of a pixel may be, for example, the value of the hue of that pixel. The three coefficients [24] are generated using three other formulae as follows:

$$x: (A-B)+(C-D)$$

$$y: (A+B)-(C+D)$$

$$z: (A-B)-(C-D)$$

It will be appreciated that any or all of these values may then be quantised: divided by a constant in order to produce a smaller number which will be less accurate but can be more effectively compressed. For example, when the sum of the values of all four pixels is divided by the number of pixels (in the present example, four), the DC value represents an average value of the pixels.

The reverse transform process is carried out in the decompression module [18] and uses the DC value [23] and coefficients [24] produced in the transform as described above. The decompression module [18] combines the coefficients [24] with the DC value [23] to recreate the original four pixels [22] using the following formulae:

$$A: W+x+y+z$$

$$B: W-x+y-z$$

$$C: W+x-y-z$$

$$D: W-x-y+z$$

This is repeated the same number of times that the data was transformed. These pixels [22] are then stored in the frame buffer [19], ready for display.

Figure 3:
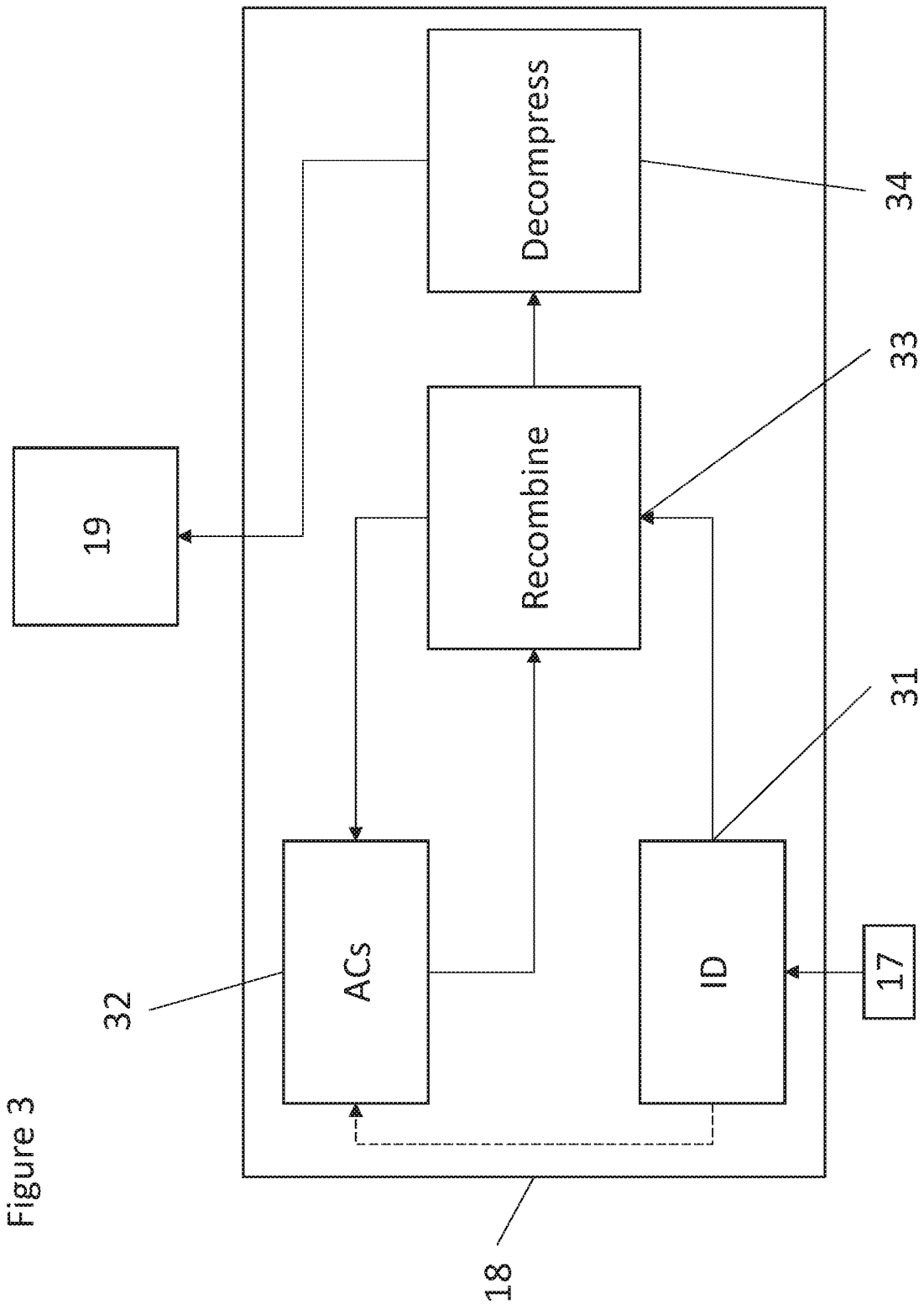
FIG. 3 shows a more detailed exemplary block diagram of the decompression module of FIG. 1.

FIG. 3 shows a more detailed exemplary block diagram of the decompression module [18], shown as part of the display control device [12] in FIG. 1. Data is transmitted to the decompression module [18] by the input module [17], and once it has been decompressed it is stored in the frame buffer [19] for display on the display panel [13], as previously described.

The decompression module [18] includes an identification module [31], which determines whether received data consists of a DC value only, or a DC value accompanied by AC values. The identification may be performed by checking the volume of data received, checking header information incorporated into the data, and/or by receiving a separate signal from the input module [17], which may determine this information by its own analysis or by using a signal from the host computing device [11]. This enables the decompression module [18] to determine how to best process the received data.

The identification module [31] is connected to a recombination module [33] so that it can pass the received data to the recombination module [33]. In this embodiment, the identification module [31] is also connected to an AC storage [32]. The AC storage [32] is an area of memory with a controller attached which is used for storing historical AC values received from the input module [17]. The AC values may be stored in the form in which they are received from the input module [17]. The identification module can signal the AC storage [32] via the connection when historical ACs are required. Since this connection is primarily for signalling, the connection is shown as a dashed arrow. In another embodiment, the recombination module [33] may signal the AC storage [32] when historical ACs are required.

The historical AC values can be used in the recombination module [33] when AC values have not been transmitted by the host computing device [11]. Accordingly, the AC storage [32] is connected to the recombination module [33] such that it can transmit data to the recombination module [33], and also so that it can receive updated AC values from the recombination module [33]. In another embodiment, it might receive updated AC values directly from the identification module [31].

The behaviour of the recombination module [33] depends on whether the identification module [31] determined that the received data comprised DC and AC values, or DC values only. In the former case, the recombination module [33] passes the received values directly to the connected decompressor [34], as well as passing the AC values to the AC storage [32] as previously mentioned. If only DC values were received, the recombination module [33] fetches historical AC values from the AC storage [32] as previously described and passes them to the decompressor [34] along with the received DC values. The decompressor [34] need not know whether it is receiving new or historical AC values.

The decompressor [34] performs decompression, including decoding, reversal of any quantisation, and application of a reverse transform in the conventional way, using the DC and AC values (which may be new or historical values) received from the recombination module [33]. The decompressor [34] is connected to the frame buffer [19] so that the decompressed data can be stored in the frame buffer [19].

FIG. 4a shows an exemplary host-side process.

At Step S41, the compression module [15] obtains DC and AC values. It may generate such values itself by carrying out—for example—a Haar transform, as previously described, on data received from the processor [14]. However, in some embodiments the processor [14] may transmit a mipmap to the compression module [15] alongside the data, and it is possible for the compression module [15] to extract DC values directly from the mipmap without performing any processing on the data itself.

At Step S42, in this embodiment, the compression module [15] determines the resources available for at least one of the compression, transmission, and decompression of the data. This may include determining the processing resources available on the host computing device [11] for compression, which is especially useful in the embodiment in which the compression module [15] receives a mipmap from the processor; if there are insufficient processing resources available on the host computing device [11] for a full compression algorithm to be carried out, the compression module [15] might skip at least a part of the compression as later described.

In another example, the output module [16] may determine that there is insufficient bandwidth available to transmit both the DC and AC values in the time available before they will be required for decompression and display. In this case, the resources being determined are bandwidth and time.

In a third example, the output module [16] may determine from communication with the input module [17] on the display control device that there is insufficient time or processing power available on the display control device [12] to handle a complete set of DC and AC values. For example, there may be insufficient bandwidth and time within the input module [17] to receive the whole frame, but there would be enough resources to receive the DCs only and retrieve the AC values from the AC store [32].

It will be appreciated that, in addition to the previously described examples, the output module may determine whether to transmit both the DC and AC values, or to preferentially transmit the DC value, based on the status of any other suitable resource of the host device or the display controller, or based on any other suitable parameter related to the connection between the host device and the display controller.

At Step S43, in this embodiment, the compression module [15] determines whether the resources are sufficient for transmission of the entire compressed frame, such as in the examples previously mentioned. If the resources are sufficient, the process follows the branch to the left beginning at "Yes" to Step S44Y. If the resources are not sufficient, the process follows the branch to the right beginning at "No" to Step S44N.

As part of making this determination, the compression module [15] might determine the time since AC values were last transmitted to the display control device [12]. This time can then be taken into account such that the longer it has been since AC values were last transmitted, the more likely it is that the compression module [15] will determine that the resources are sufficient, since after a period of time the risk of inaccurate stored AC values and the resulting errors may begin to outweigh the risk of insufficient resources and the resulting delay. Optionally, there may be a threshold after which AC values are transmitted regardless of the available resources, in which case again the process follows the branch to the left beginning at "Yes" to Step S44Y.

At Step S44Y, the compression module [15] compresses the data in the conventional way to produce a DC value and AC values, then passes the values to the output module [16] for transmission to the display control device [12] in the conventional way.

In some cases, especially where the limited resource in question is bandwidth, the compression module [15] may still produce DC and AC values but further compress the AC values, for example by quantising them to a greater degree than the DC values, leading to greater data loss but a smaller volume of data for the AC values. This may result in a more accurate outcome than using historical AC values, but may advantageously result in a smaller volume of data for transmission. This solution might also be used, for example, when the reason that the compression module [15] determined to transmit the AC values as well as the DC values was that a significant time had passed since AC values were last transmitted.

At Sep 544N, in this embodiment, the compression module [15] either extracts DC values from a mipmap or compresses the display data in the conventional way and discards the AC values to retain only the DC values. It then passes the DC values to the output module [16] for transmission to the display control device [12].

In another embodiment, the compression module [15] might always compress the data in the conventional way and pass it to the output module [16], and the output module [16] might then determine whether there are sufficient resources to transmit the DC and AC values or only the DC values. In this case, if the output module [16] determines that there are insufficient resources, it can discard the AC values and transmit only the DC values or store the AC values and transmit them at a later time if there are more resources available, in order to update the stored values on the display control device [12].

In some embodiments, especially where bandwidth or processing power is limited, the processes illustrated in FIG. 4a could be carried out on changed areas of a frame only, whereas the rest of the frame is either not transmitted at all, in which case the corresponding data from the previous frame could be used, or the rest of the frame could be transmitted as DC values only regardless of the available resources. This would beneficially allow the ACs to be updated for changed areas even if there are insufficient resources to transmit the DC and AC values for the entire frame.

Figure 4B:
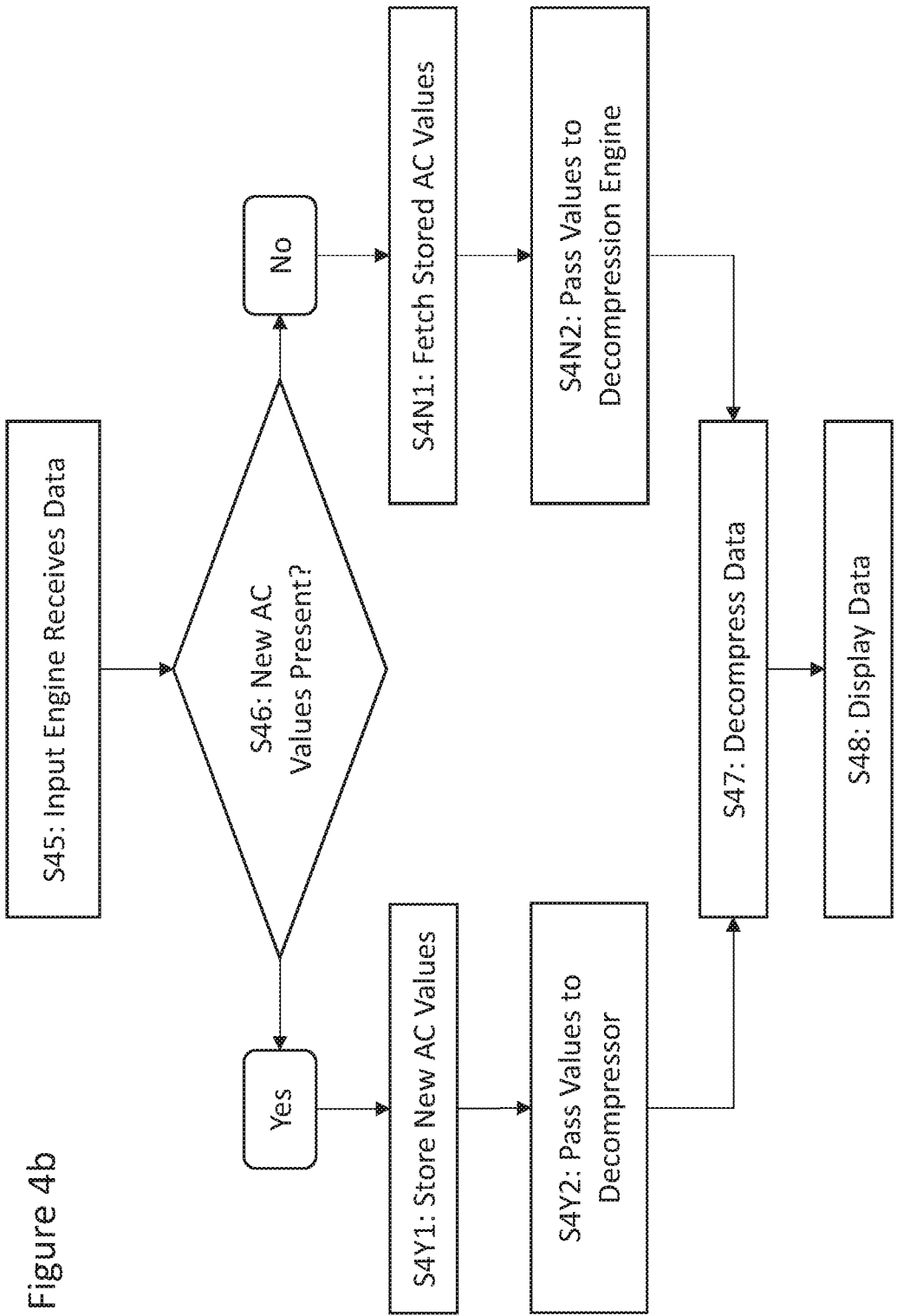
FIG. 4b shows an exemplary process of receiving and decompressing data.

The process then moves to the display control device process shown in FIG. 4b, beginning at Step S45.

At Step S45, the input module [17] on the display control device [12] receives the transmitted data, either DC values, or DC and AC values. It passes these values to the decompression module [18], where they are received by the identification module [31].

At Step S46, the identification module [31] determines whether the data it has received comprises DC values, or DC and AC values. If there are DC and AC values present, it is determined that there are new AC values available and the process follows the branch to the left beginning at "Yes", to Step S4Y1. Otherwise, historical AC values are required, and the process follows the branch to the right beginning at "No", to Step S4N1.

In an embodiment where it is possible for the host computing device to send only AC values, separately from their corresponding DC values, this would also be determined by the identification module [31], which could then store the new AC values in the AC storage [32]. After this, the process would end.

At Step S4Y1, the decompression module [18] stores the new AC values in the AC storage [32]. As previously described, this may be done by the recombination module [33] or the identification module [31]. This then means that there are updated AC values available for future frames if there are insufficient resources available to transmit their actual AC values.

At Step S4Y2, the recombination module [33] passes the DC and AC values to the decompressor [34] as previously mentioned.

If there were no new AC values available, the process follows the branch to the right beginning at "No" to Step S4N1, at which the recombination module [33] fetches historical AC values from the AC storage [32]. These will allow the decompression module [18] to produce an approximation of the original data generated by the application running on the processor [14], on the assumption that the more detailed high-frequency coefficients (AC values) will not have changed much between frames.

At Step S4N2, the recombination module [33] then passes the received DC values and the AC values fetched from the AC storage [32] to the decompressor [34].

Both processes then reach Step S47, at which the decompressor [34] decompresses the data in the conventional way. The decompressor [34] need not be aware of whether the AC values it has received are current AC values received from the host computing device [11], or historical AC values fetched from the AC storage [32].

At Step S48, the decompressor [34] stores the decompressed data in the frame buffer [19], and it is then passed to the display panel [13] for display. If the methods were applied to only part of the frame, such as a changed area, this area or at least its edges might be slightly blurred in order to conceal any errors introduced by the use of historical AC values. Alternatively or additionally, blurring could be applied in the periphery of the displayed image, leaving the foveal area of the image clear.

Figure 5:
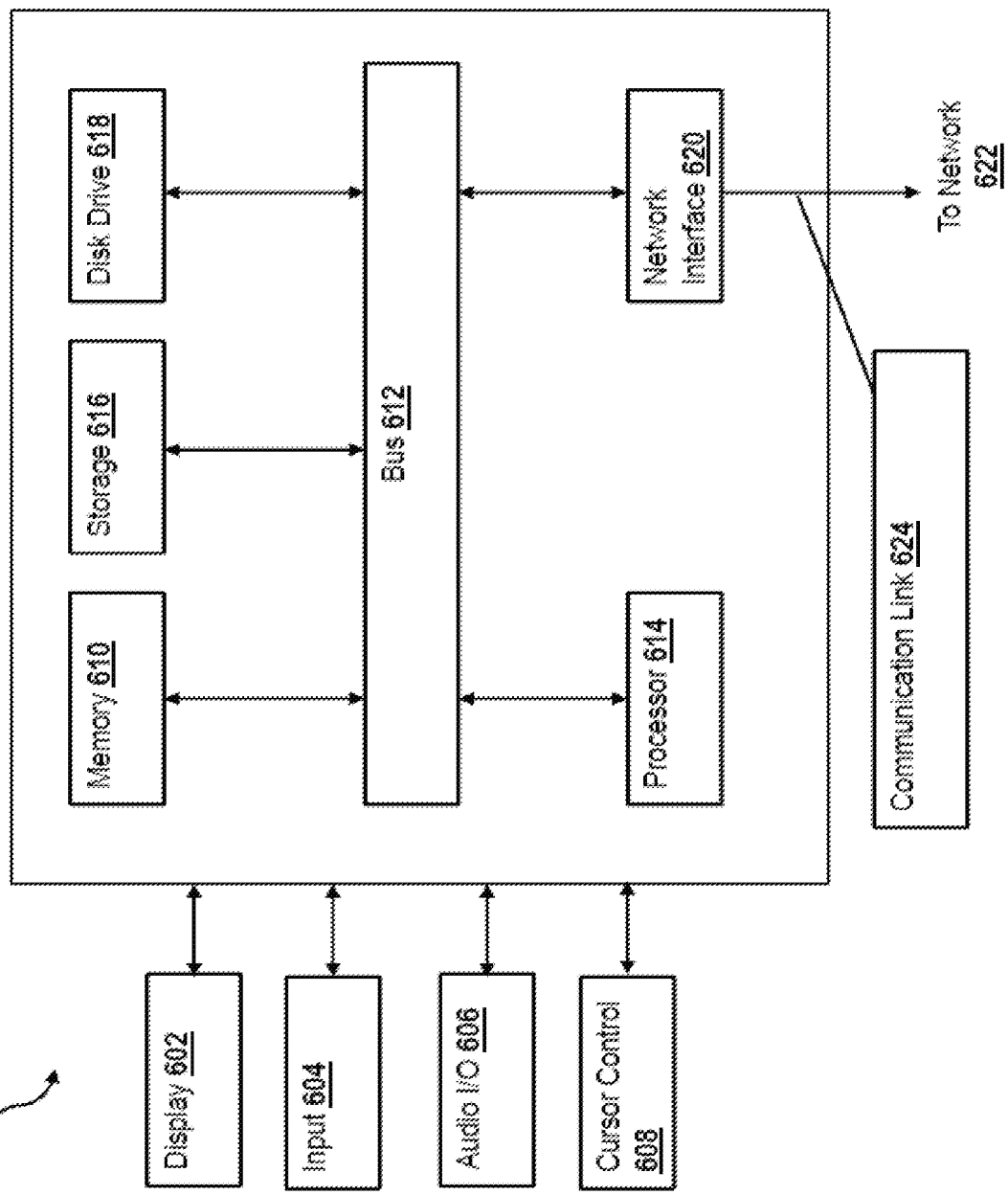
FIG. 5 illustrates a block diagram of an exemplary computer system.

FIG. 5 is a block diagram of a computer system 600 suitable for implementing one or more embodiments of the present disclosure, including the host computing device [11] or the display control device [12]. In various implementations, the host computing device [11] may include a mobile cellular phone, personal computer (PC), laptop, wearable computing device, etc. adapted for wireless communication, and each of the host computing device [11] or the display control device [12] may include a network computing device. Thus, it should be appreciated that these devices [11, 12] may be implemented as the computer system 600 in a manner as follows.

The computer system 600 includes a bus 612 or other communication mechanism for communicating information data, signals, and information between various components of the computer system 600. The components include an input/output (I/O) component 604 that processes a user action, such as selecting keys from a keypad/keyboard, selecting one or more buttons or links, etc., and sends a corresponding signal to the bus 612. The I/O component 604 may also include an output component, such as a display 602 and a cursor control 608 (such as a keyboard, keypad, mouse, etc.). An optional audio input/output component 606 may also be included to allow a user to use voice for inputting information by converting audio signals. The audio I/O component 606 may allow the user to hear audio. A transceiver or network interface 620 transmits and receives signals between the computer system 600 and other devices via network 622. In one embodiment, the transmission is wireless, although other transmission mediums and methods may also be suitable. A processor 614, which can be a micro-controller, digital signal processor (DSP), or other processing component, processes these various signals, such as for display on the computer system 600 or transmission to other devices via a communication link 624. The processor 614 may also control transmission of information, such as cookies or IP addresses, to other devices.

The components of the computer system 600 also include a system memory component 610 (e.g., RAM), a static storage component 616 (e.g., ROM), and/or a disk drive 618 (e.g., a solid-state drive, a hard drive). The computer system 600 performs specific operations by the processor 614 and other components by executing one or more sequences of instructions contained in the system memory component 610. For example, the processor 614 could be utilised to perform the compression and transmission functions of the host computing device [11], or the receiving and decompression functions of the display control device [12].

Executable logic for performing any described functions may be encoded in a computer readable medium, which may refer to any medium that participates in providing instructions to the processor 614 for execution. Such a medium may take many forms, including but not limited to, non-volatile media, volatile media, and transmission media. In various implementations, non-volatile media includes optical or magnetic disks, volatile media includes dynamic memory, such as the system memory component 610, and transmission media includes coaxial cables, copper wire, and fiber optics, including wires that comprise the bus 612. In one embodiment, the logic is encoded in non-transitory computer readable medium, such as a magnetic or optical disk or other magnetic/optical storage medium, or FLASH or other solid-state memory (e.g. integrated into a device or in the form of a memory card). In one example, transmission media may take the form of acoustic or light waves, such as those generated during radio wave, optical, and infrared data communications.

In various embodiments of the present disclosure, execution of instruction sequences to practice the present disclosure may be performed by the computer system 600. In various other embodiments of the present disclosure, a plurality of computer systems 600 coupled by the communication link 624 to the network (e.g., such as a LAN, WLAN, PTSN, and/or various other wired or wireless networks, including telecommunications, mobile, and cellular phone networks) may perform instruction sequences to practice the present disclosure in coordination with one another.

The above embodiments and examples are to be understood as illustrative examples. Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

Software in accordance with the present disclosure, such as program code and/or data, may be stored on one or more computer readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

The various features and steps described herein may be implemented as systems comprising one or more memories storing various information described herein and one or more processors coupled to the one or more memories and a network, wherein the one or more processors are operable to perform steps as described herein, as non-transitory machine-readable medium comprising a plurality of machine-readable instructions which, when executed by one or more processors, are adapted to cause the one or more processors to perform a method comprising steps described herein, and methods performed by one or more devices, such as a hardware processor, user device, server, and other devices described herein.

What is claimed is:

1. A method for compressing display data at a host device for transmission to a client device, wherein the display data comprises groups of pixels, the groups of pixels together forming an image frame, each pixel having a corresponding pixel value, the method comprising:
   receiving pixel values for a group of pixels in an image frame of the display data;
   performing a wavelet transformation on the group of pixels to obtain a general approximation coefficient and a plurality of detail coefficients for the group of pixels;
   determining whether to prioritise transmission of the general approximation coefficient over transmission of the detail coefficients to the client device based on whether there are sufficient resources available to enable the image frame to be ready for display by the client device and/or based on a time since the detail coefficients for a corresponding group in a previous frame were previously transmitted to the client device; and
   in response to determining to prioritise transmission of the general approximation coefficient over transmission of the detail coefficients:
   transmitting only the general approximation coefficient to the client device, or
   compressing at least one detail coefficient so as to be more compressed than the general approximation coefficient and transmitting the general approximation coefficient and the at least one compressed detail coefficient to the client device.

2. The method according to claim 1, wherein if it is determined that transmission of the general approximation coefficient is to be prioritised over transmission of the detail coefficients, determining whether only the general approximation coefficient is to be transmitted to the client device, or whether the general approximation coefficient and the at least one compressed detail coefficient is to be transmitted to the client device, based on whether there are sufficient resources available to enable the image frame to be ready for display by the client device and/or based on the time since the at least one detail coefficient for a corresponding group in a previous frame was previously transmitted to the client device.

3. The method according to claim 2, wherein determining whether only the general approximation coefficient is to be transmitted to the client device, or whether the general approximation coefficient and the at least one compressed detail coefficient is to be transmitted to the client device comprises:
   determining resources available to enable the image frame to be ready for display by the client device;
   determining whether there are sufficient resources for the at least one compressed detail coefficient to be transmitted, together with the general approximation coefficient, whether uncompressed or compressed, and used to enable the image frame to be ready for display by the client device; and
   if it is determined that there are sufficient resources for the at least one compressed detail coefficient to be transmitted, together with an uncompressed general approximation coefficient, and used to enable the image frame to be ready for display by the client device, compressing the at least one detail coefficient and transmitting the uncompressed general approximation coefficient and the at least one compressed detail coefficient to the client device;

if it is determined that there are insufficient resources for the at least one compressed detail coefficient to be transmitted, together with the uncompressed general approximation coefficient, and used to enable the image frame to be ready for display by the client device, determining whether there are sufficient resources for the at least one compressed detail coefficients to be transmitted, together with a compressed general approximation coefficient, and used to enable the image frame to be ready for display by the client device, and, if it is determined that there are sufficient resources for the at least one compressed detail coefficient to be transmitted, together with a compressed general approximation coefficient, and used to enable the image frame to be ready for display by the client device, compressing the at least one detail coefficient and compressing the general approximation coefficient, wherein the at least one detail coefficient is compressed at a higher level than the general approximation coefficient, and transmitting the compressed general approximation coefficient and the at least one compressed detail coefficient to the client device;

if it is determined that there are insufficient resources for compressed detail coefficients to be transmitted, together with the compressed general approximation coefficient, and used to enable the image frame to be ready for display by the client device, determining whether there are sufficient resources for only the uncompressed general approximation coefficient to be transmitted to the client device, and used to enable the image frame to be ready for display by the client device, and if it is determined that there are sufficient resources for only the uncompressed general approximation coefficient to be transmitted to the client device, and used to enable the image frame to be ready for display by the client device, transmitting only the uncompressed general approximation coefficient to the client device; and if it is determined that there are insufficient resources for only the uncompressed general approximation coefficient to be transmitted to the client device, and used to enable the image frame to be ready for display by the client device, compressing the general approximation coefficient, and transmitting only the compressed general approximation coefficient to the client device.

4. The method according to claim 3, wherein if it is determined that there are sufficient resources for the at least one compressed detail coefficient to be transmitted, together with the uncompressed general approximation coefficient:

determining a first level of compression that enables the at least one compressed detail coefficient to be transmitted, together with the uncompressed general approximation coefficient, and used to enable the image frame to be ready for display by the client device; and compressing the at least one detail coefficient using the first level of compression.

5. The method according to claim 3, wherein if it is determined that there are sufficient resources for the at least one compressed detail coefficient to be transmitted, together with the compressed general approximation coefficient:

determining a second level of compression that enables the at least one compressed detail coefficient to be transmitted, together with the compressed general approximation coefficient, and used to enable the image frame to be ready for display by the client device;

determining a third level of compression to be applied to the general approximation coefficient to be transmitted, together with the at least one compressed detail coefficient, and used to enable the image frame to be ready for display by the client device, wherein the second level of compression is higher than the third level of compression;

compressing the at least one detail coefficient using the second level of compression; and compressing the general approximation coefficient using the third level of compression.

6. The method according to claim 3, wherein if it is determined that there are insufficient resources for only the uncompressed general approximation coefficient to be transmitted to the client device, and used to enable the image frame to be ready for display by the client device:

determining a fourth level of compression for the general approximation coefficient to enable the compressed general approximation coefficient to be transmitted to the client device, and used to enable the image frame to be ready for display by the client device; and compressing the general approximation coefficient using the fourth level of compression.

7. The method according to claim 1, wherein compressing at least one detail coefficient so as to be more compressed than the general approximation coefficient comprises:

determining resources available to enable the image frame to be ready for display by the client device;

determining whether there are sufficient resources for the at least one compressed detail coefficient to be transmitted, together with an uncompressed general approximation coefficient, and used to enable the image frame to be ready for display by the client device;

if it is determined that there are sufficient resources for the at least one compressed detail coefficient to be transmitted, together with the uncompressed general approximation coefficient, and used to enable the image frame to be ready for display by the client device, compressing the at least one detail coefficient and transmitting the uncompressed general approximation coefficient and the at least one compressed detail coefficient to the client device; and if it is determined that there are insufficient resources for the at least one compressed detail coefficient to be transmitted, together with the uncompressed general approximation coefficient, and used to enable the image frame to be ready for display by the client device, compressing the at least one detail coefficient and compressing the general approximation coefficient, wherein the at least one detail coefficient is compressed at a higher level than the general approximation coefficient, and transmitting the compressed general approximation coefficient and the at least one compressed detail coefficient to the client device.

8. The method according to claim 7, wherein if it is determined that there are sufficient resources for the at least one compressed detail coefficient to be transmitted, together with the uncompressed general approximation coefficient:

determining a first level of compression that enables the at least one compressed detail coefficient to be transmitted, together with the uncompressed general approximation coefficient, and used to enable the image frame to be ready for display by the client device; and compressing the at least one detail coefficient using the first level of compression.

9. The method according to claim 7, wherein if it is determined that there are insufficient resources for the at least one compressed detail coefficient to be transmitted, together with the uncompressed general approximation coefficient, and used to enable the image frame to be ready for display by the client device:

determining a second level of compression that enables the at least one compressed detail coefficient to be transmitted, together with the compressed general approximation coefficient, and used to enable the image frame to be ready for display by the client device;

determining a third level of compression to be applied to the general approximation coefficient to be transmitted, together with the at least one compressed detail coefficient, and used to enable the image frame to be ready for display by the client device, wherein the second level of compression is higher than the third level of compression;

compressing the at least one detail coefficient using the second level of compression; and compressing the general approximation coefficient using the third level of compression.

10. The method according to claim 1, wherein the resources available to enable the image frame to be ready for display by the client device comprise one or more of:

actual or estimated capabilities of the host device, comprising an actual or estimated capability of a processing resource of the host device;

actual or estimated capabilities of the client device, comprising an actual or estimated capability of a processing resource of the client device; or actual or estimated capabilities of a transport mechanism between the host device and the client device or changes in the transport mechanism, wherein the transport mechanism comprises a bandwidth limited connection and/or the actual or estimated capability of the transport mechanism comprises an actual or estimated available bandwidth.

11. The method according to claim 1, wherein the time since the detail coefficients for a corresponding group in a previous frame were previously transmitted to the client device comprises either a time since compressed detail coefficients for a corresponding group in a previous frame were sent to the client device or a time since uncompressed detail coefficients for a corresponding group in a previous frame were sent to the client device; the method further comprising either a) determining whether the time since compressed detail coefficients for a corresponding group in a previous frame were sent to the client device exceeds a threshold time; and if it is determined that the time since compressed detail coefficients for a corresponding group in a previous frame were sent to the client device exceeds the threshold time, determining that the detail coefficients are to be transmitted to the client device; or b) determining whether the time since uncompressed detail coefficients for a corresponding group in a previous frame were sent to the client device exceeds a threshold time; and if it is determined that the time since uncompressed detail coefficients for a corresponding group in a previous frame were sent to the client device exceeds the threshold time, determining that the detail coefficients are to be transmitted to the client device.

12. The method according to claim 1, wherein a) the general approximation coefficient is generated using a mipmap associated with the frame of display data; and/or b) the method further comprises:

determining, for the group of pixels, whether there has been a change in at least one pixel value of the pixels in the group compared to the corresponding pixel values of the corresponding group of pixels of a previous frame of display data; and transmitting the at least one detail coefficient to the client device only when there has been a change in at least one of the pixel values.

13. The method according to claim 1, wherein the general approximation coefficient and the detail coefficients are obtained from the pixel values of the pixels in the group of pixels according to:

$$W=(A+B)+(C+D);$$

$$x=(A-B)+(C-D);$$

$$y=(A+B)-(C+D);$$

$$z=(A-B)-(C-D);$$

where:

A, B, C, and D are the pixel values of the pixels in the group of pixels;

W is the general approximation coefficient; and x, y and z are the detail coefficients.

14. The method according to claim 1, wherein the wavelet transformation is a Haar transformation.

15. A method of decompressing compressed display data at a client device, the method comprising:

receiving, from a host device, compressed display data;

determining whether the received compressed display data comprises only a general approximation coefficient, or whether the received compressed display data comprises the general approximation coefficient and at least one detail coefficient for a group of pixels to be displayed, the general approximation coefficient and the at least one detail coefficient having been obtained using a wavelet transformation of the group of pixels;

if it is determined that the received compressed display data comprises only the general approximation coefficient, retrieving at least one detail coefficient previously received from the host device and stored at the client device; and decompressing the compressed display data using the general approximation coefficient and the retrieved at least one detail coefficient to produce pixel values of pixels in the group of pixels to be displayed.

16. The method according to claim 15, wherein either:

a) the received compressed display data includes a header comprising an indication of whether the received compressed display data comprises only the general approximation coefficient, or whether the received compressed display data comprises the general approximation coefficient and at least one detail coefficient, and the determination of whether the received compressed display data comprises only the general approximation coefficient, or whether the received compressed display data comprises the general approximation coefficient and at least one detail coefficient is made using the indication;

or b) the method further comprises:

receiving a signal from the host device, the signal being transmitted separately from the compressed display data, and the signal comprising an indication of whether the received compressed display data comprises only the general approximation coefficient, or whether the received compressed display data comprises the general approximation coefficient and at least one detail coefficient, and the determination of whether the received compressed display data comprises only the general approximation coefficient, or whether the received compressed display data comprises the general approximation coefficient and at least one detail coefficient is made using the indication.

17. The method according to claim 15, wherein the wavelet transformation is a Haar transformation.

18. A host device configured to:

receive pixel values for a group of pixels in an image frame of display data;

perform a wavelet transformation on the group of pixels to obtain a general approximation coefficient and a plurality of detail coefficients for the group of pixels;

determine whether to prioritise transmission of the general approximation coefficient over transmission of the detail coefficients to the client device based on whether there are sufficient resources available to enable the image frame to be ready for display by the client device and/or based on a time since the detail coefficients for a corresponding group in a previous frame were previously transmitted to the client device; and in response to determining to prioritise transmission of the general approximation coefficient over transmission of the detail coefficients:

transmit only the general approximation coefficient to the client device, or compress at least one detail coefficient so as to be more compressed than the general approximation coefficient and transmit the general approximation coefficient and the at least one compressed detail coefficient to the client device.

19. A client device configured to:

receive, from a host device, compressed display data;

determine whether the received compressed display data comprises only a general approximation coefficient, or whether the received compressed display data comprises the general approximation coefficient and at least one detail coefficient for a group of pixels to be displayed, the general approximation coefficient and the at least one detail coefficient having been obtained using a wavelet transformation of the group of pixels;

if it is determined that the received compressed display data comprises only the general approximation coefficient, retrieve at least one detail coefficient previously received from the host device and stored at the client device; and decompress the compressed display data using the general approximation coefficient and the retrieved at least one detail coefficient to produce pixel values of pixels in the group of pixels to be displayed.

20. A system comprising:

a host device configured to:

receive pixel values for a group of pixels in an image frame of display data;

perform a wavelet transformation on the group of pixels to obtain a general approximation coefficient and a plurality of detail coefficients for the group of pixels;

determine whether to prioritise transmission of the general approximation coefficient over transmission of the detail coefficients to the client device based on whether there are sufficient resources available to enable the image frame to be ready for display by the client device and/or based on a time since the detail coefficients for a corresponding group in a previous frame were previously transmitted to the client device; and in response to determining to prioritise transmission of the general approximation coefficient over transmission of the detail coefficients:

transmit only the general approximation coefficient to the client device, or compress at least one detail coefficient so as to be more compressed than the general approximation coefficient and transmit the general approximation coefficient and the at least one compressed detail coefficient to the client device; and a client device configured to:

receive, from the host device, compressed display data;

determine whether the received compressed display data comprises only a general approximation coefficient, or whether the received compressed display data comprises the general approximation coefficient and at least one detail coefficient for a group of pixels to be displayed, the general approximation coefficient and the at least one detail coefficient having been obtained using a wavelet transformation of the group of pixels;

if it is determined that the received compressed display data comprises only the general approximation coefficient, retrieve at least one detail coefficient previously received from the host device and stored at the client device; and decompress the compressed display data using the general approximation coefficient and the retrieved at least one detail coefficient to produce pixel values of pixels in the group of pixels to be displayed.

\* \* \* \* \*